(12) United States Patent
Huang et al.

(10) Patent No.: US 11,395,401 B1
(45) Date of Patent: Jul. 19, 2022

(54) PRINTED CIRCUIT BOARD STRUCTURE AND METHOD FOR IMPROVED ELECTROMAGNETIC COMPATIBILITY PERFORMANCE

(71) Applicant: Marvell Asia Pte, Ltd., Singapore (SG)

(72) Inventors: Shaowu Huang, Sunnyvale, CA (US); Dance Wu, Palo Alto, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 10 days.

(21) Appl. No.: 17/146,185

(22) Filed: Jan. 11, 2021

Related U.S. Application Data

(60) Provisional application No. 62/959,676, filed on Jan. 10, 2020.

(51) Int. Cl.
H05K 1/02 (2006.01)

(52) U.S. Cl.
CPC ......... H05K 1/0215 (2013.01); H05K 1/0218 (2013.01)

(58) Field of Classification Search
CPC .... H05K 1/0215; H05K 1/0216; H05K 1/023; H05K 1/0231; H05K 1/18; H05K 1/181; H05K 1/16; H05K 1/162
See application file for complete search history.

(56) References Cited

U.S. PATENT DOCUMENTS

| | | | | |
|---|---|---|---|---|
| 2003/0198035 A1* | 10/2003 | Glaser | ................ | H05K 1/0216 361/803 |
| 2004/0061566 A1* | 4/2004 | Tsang | ................ | H05K 1/0215 333/12 |
| 2019/0223287 A1* | 7/2019 | Nishida | ................ | B60R 16/06 |
| 2019/0258213 A1* | 8/2019 | Ock | ................ | B60L 58/10 |

* cited by examiner

*Primary Examiner* — Hoa C Nguyen
*Assistant Examiner* — Amol H Patel

(57) ABSTRACT

A printed circuit board configured to be coupled to an automotive Ethernet connection includes a signal line layer on which a signal path is disposed, a ground layer disposed above the signal line layer, the ground layer including a digital ground and a chassis ground electrically insulated from the digital ground, a first capacitor and a second capacitor. The first capacitor and the second capacitor each couple the digital ground and the chassis ground. The first capacitor is positioned at a first distance from the signal path, and the second capacitor is symmetrically positioned, relative to the first capacitor, at a second distance from the signal path, where the second distance is substantially equal to the first distance.

20 Claims, 5 Drawing Sheets

PRINTED CIRCUIT BOARD STRUCTURE AND METHOD FOR IMPROVED ELECTROMAGNETIC COMPATIBILITY PERFORMANCE

CROSS REFERENCE TO RELATED APPLICATION

This disclosure claims the benefit of commonly-assigned U.S. Provisional Patent Application No. 62/959,676, filed Jan. 10, 2020, which is hereby incorporated by reference herein in its entirety.

FIELD OF USE

This disclosure relates to a printed circuit board (PCB) having (i) a separated digital ground and a chassis ground, or (ii) a separated cable ground if there only a cable without a chassis. More particularly this disclosure relates to a printed circuit board using capacitive elements to mitigate electromagnetic compatibility (EMC) concerns caused by separated digital ground and chassis ground.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Gigabit Ethernet is designed to transmit Ethernet frames at a rate of one gigabit per second (1 Gb/s). Gigabit Ethernet uses physical layer (PHY) processing devices that may be compliant with a standard such as 1000 Base-T1, defined by the Institute of Electrical and Electronics Engineers (802.3 bp) Ethernet standard. A 1000 Base-T1 PHY processing device supports full-duplex operation at 1 Gb/s over a single twisted copper wire pair. Similarly, 100 Base-T1 PHY processing devices support full-duplex operation at 100 megabits per second (100 Mb/s). In some implementations, 1000 Base-T1 PHY processing devices and 100 Base-T1 PHY processing devices are called upon to operate in severely constrained environments, such as automotive and industrial environments in which certain electromagnetic compatibility (EMC) requirements must be met. Multi-Gig Ethernet is similar to Gigabit Ethernet but operates at higher data rates and has more stringent requirement for electromagnetic compatibility.

For example, in automotive Ethernet applications, an automotive Ethernet transceiver is used at either end of an automotive Ethernet link between different parts of a vehicle. An automotive Ethernet transceiver is typically mounted on a printed circuit board. In order to meet the EMC requirements, the printed circuit board connecting the automotive Ethernet transceiver to the single twisted copper wire pair carrying data from a second automotive Ethernet transceiver, separates a chassis ground (e.g., connecting the single twisted copper wire pair carrying data transmitted from a second automotive Ethernet transceiver) and a digital ground (e.g., connecting to a transceiver of an Electronic Control Unit (ECU)). However, use of separated chassis and digital grounds cause various other EMC problems within automotive interfaces. These EMC problems can occur within automotive Ethernet with either unshielded or shielded cables using separated chassis and digital grounds.

SUMMARY

In accordance with some implementations of the subject matter of this disclosure, a printed circuit board configured to be coupled to an automotive Ethernet connection includes a signal line layer on which a signal path is disposed, a ground layer disposed above the signal line layer, the ground layer including a digital ground and a chassis ground electrically insulated from the digital ground, a first capacitor and a second capacitor.

In a first implementation of such a printed circuit board the first capacitor and the second capacitor each couple the digital ground and the chassis ground. The first capacitor is positioned at a first distance from the signal path, and the second capacitor is symmetrically positioned, relative to the first capacitor at a second distance from the signal path, where the second distance is substantially equal to the first distance.

A second implementation of such a printed circuit board may further include at least a third capacitor coupling the digital ground and the chassis ground, wherein the third capacitor is positioned at a third distance from the signal path, and at least a fourth capacitor coupling the digital ground and the chassis ground, wherein the fourth capacitor is symmetrically positioned, relative to the third capacitor, at a fourth distance the signal path, and wherein the third distance is substantially equal to the fourth distance.

In a first instance of that second implementation, the printed circuit board may replace the at least third capacitor and the at least fourth capacitor with a respective plurality of capacitors.

In a first instance of that first implementation, each of the first capacitor and the second capacitor are embedded into the ground layer of the printed circuit board.

In a second instance of that first implementation, each of the first capacitor and the second capacitor are mounted on top of the printed circuit board.

In a third instance of that first implementation, the signal path is a differential signal path.

In a fourth instance of that first implementation, the first capacitor and the second capacitor are positioned on opposite sides of the signal path.

A third implementation of such a printed circuit board includes a first resistor coupling the digital ground and the chassis ground, where the first resistor is positioned at a third distance from the signal path, and a second resistor coupling the digital ground and the chassis ground, where the second resistor is symmetrically positioned, relative to the first resistor, at a fourth distance from the signal path, and where the third distance is substantially equal to the fourth distance.

In a fourth implementation of such a printed circuit board, a first resistor is connected in series to the first capacitor, where the first resistor connected in series to the first capacitor is positioned at a third distance from the signal path. A second resistor is connected in series to the second capacitor, where the second resistor connected in series to the second capacitor is symmetrically positioned, relative to the first resistor connected in series to the first capacitor at a fourth distance from the signal path, and where the third distance is substantially equal to the fourth distance.

In a fifth instance of that first implementation, the digital ground is electrically insulated from the chassis ground via a dielectric material.

According to other implementations of the subject matter of this disclosure, a method of configuring a printed circuit board for coupling to an automotive Ethernet connection includes determining a position for at least a first capacitor to couple a digital ground and a chassis ground so that the first capacitor is positioned at a first distance from the signal path, determining a position for at least a second capacitor to couple the digital ground and the chassis ground so that the second capacitor is symmetrically positioned, relative to the first capacitor at a second distance from the signal path, where the second distance is substantially equal to the first distance, and mounting each of the first capacitor and the second capacitor at the respective determined positions for the first capacitor and the second capacitor on the printed circuit board.

A first implementation of such a method may further include determining a position of at least a third capacitor coupling the digital ground and the chassis ground so that the third capacitor is positioned at a third distance from the signal path, determining a position of at least a fourth capacitor coupling the digital ground and the chassis ground, so that the fourth capacitor is symmetrically positioned, relative to the third capacitor, at a fourth distance the signal path, and wherein the third distance is substantially equal to the fourth distance, and mounting the at least third capacitor and the at least fourth capacitor at the respective determined positions for the at least third capacitor and the at least fourth capacitor on the printed circuit board.

A first instance of that first implementation of such a method further includes mounting a plurality of capacitors to replace each of the at least third capacitor and the at least fourth capacitor.

A second implementation of such a method includes embedding each of the first capacitor and the second capacitor into the ground layer of the printed circuit board.

A second implementation of such a method includes mounting each of the first capacitor and the second capacitor at the respective determined positions for the first capacitor and the second capacitor on top of the printed circuit board.

A third implementation of such a method includes the signal path being a differential signal path.

A fourth implementation of such a method includes mounting the first capacitor and the second capacitor on opposite sides of the signal path.

A fifth implementation of such a method includes determining a position of a first resistor so that the first resistor is positioned at a third distance from the signal path, determining a position of a second resistor so that the second resistor is symmetrically positioned, relative to the first resistor, at a fourth distance from the signal path, and wherein the third distance is equal to the fourth distance, and mounting each of the first resistor and the second resistor at the respective determined positions for the first resistor and the second resistor on the printed circuit board.

A sixth implementation of such a method includes determining a position of a first resistor connected in series to the first capacitor so that the first resistor connected in series to the first capacitor is positioned at a third distance from the signal path, determining a position of a second resistor connected in series to the second capacitor so that the second resistor connected in series to the second capacitor is symmetrically positioned, relative to the first resistor connected in series to the first capacitor, at a fourth distance from the signal path, and where the third distance is equal to the fourth distance. The method may further include mounting (i) the first resistor connected in series to the first capacitor and (ii) the second resistor connected in series to the second capacitor at the respective determined positions for the first resistor and the second resistor on the printed circuit board.

A seventh implementation of such a method may further include electrically insulating the digital ground from the chassis ground via a dielectric material.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, there are significant challenges in order to meet certain electromagnetic compatibility (EMC) requirements when Ethernet connection is used in automotive high-speed interfaces. For example, in automotive Ethernet applications, an automotive Ethernet transceiver is used at either end of an automotive Ethernet link between different parts of a vehicle. The automotive Ethernet transceivers are mounted on printed circuit boards. In order to meet the EMC requirements, a chassis or cable ground (e.g., connecting a single twisted copper wire pair carrying data transmitted from a second automotive Ethernet transceiver) is often separated (i.e., electrically insulated) from a digital ground (e.g., connecting to a transceiver of an Electronic Control Unit (ECU)) on a printed circuit board.

In one particular implementation with unshielded cables, the chassis ground and the digital ground are each connected individually to a main ground. However, such double grounding techniques create ground loops which cause low frequency electromagnetic interference (EMI) problems.

A common approach to eliminating ground loops in digital systems with differential (or single-ended) signal cabling is to couple the chassis ground and the digital ground using a capacitor. This allows for the DC current to be filtered out via the capacitors thereby improving EMC performance. However, addition of capacitors can cause signal return path discontinuities thereby exacerbating other EMC problems.

The subject matter of this disclosure may be better understood by reference to FIGS. 1-7.

Figure 1:
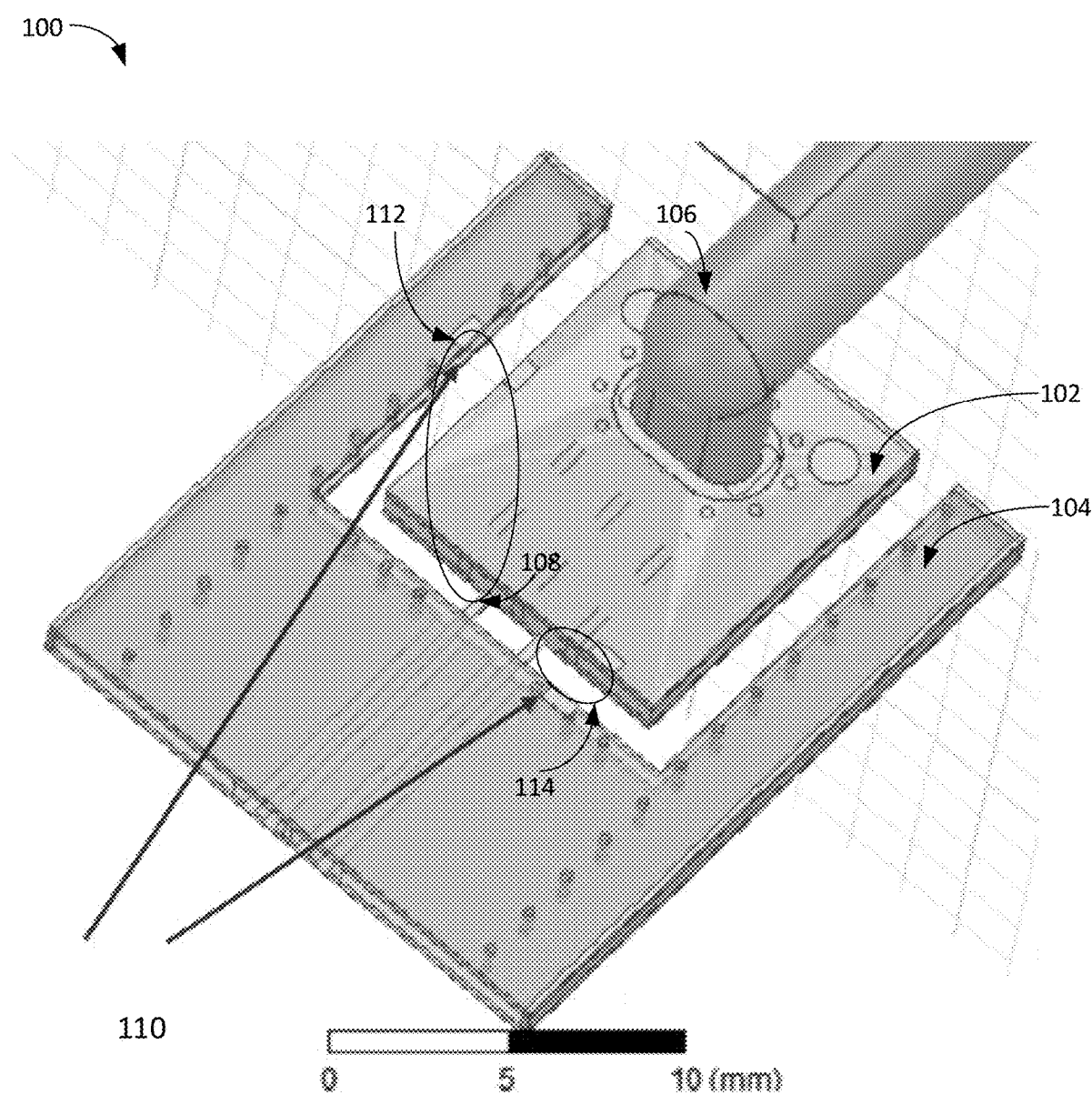
FIG. 1 is a perspective view of a portion of a printed circuit board incorporating a first implementation of the subject matter of this disclosure.

FIG. 1 shows a portion of a printed circuit board 100 with a chassis ground 102 and a digital ground 104. In one implementation, chassis ground 102 is a metal housing encasing shielded single twisted copper wire pair 106. Any malfunctions to the equipment that short into the chassis ground 102 will cause a current to flow through the chassis to ground. Digital ground 104 is a "reference" terminal of a power supply for digital logic, in accordance with one implementation. Since digital circuits operate in a dynamic state (i.e., continuous operation), they generate a lot of noise. In order to isolate the noise from the analog signals, digital ground 104 is electrically isolated from chassis ground 102. As seen in FIG. 1, the gap between chassis ground 102 and digital ground 104 serves to electrically isolate the digital ground from the chassis ground. In an automotive Ethernet implementation, a layer of dielectric material separates chassis ground 102 from digital ground 104 on a printed circuit board. Shielded single twisted copper wire pair 106 is used to connect one automotive Ethernet device (not shown) to an Electronic Control Unit (ECU) corresponding to digital ground 104. Shielded single twisted copper wire pair 106 is grounded via connection to chassis ground 102. Signal transmission line 108 carries a differential (or single-ended) signal from the one automotive Ethernet device to the ECU and returns a second differential (or single-ended) signal from ECU to the one automotive Ethernet device.

As discussed above, one solution for improving EMC performance for separated chassis and digital grounds includes providing capacitive elements to couple the two grounds. As shown in FIG. 1, there are two capacitors 110 coupling the digital ground 104 and chassis ground 102. An impedance of a signal associated with the return path in such an implementation can be approximated using the following equation:

$$Z = \sqrt{(R + 2*\pi*f*L)/(G + j*2*\pi*f*C)}$$

where Z is the signal impedance, R is the series resistance of the conductor in ohms per unit length (DC resistance), G is the shunt conductance in Siemens (S) per unit length, j is a symbol indicating that the term has a phase angle of +90 degrees (imaginary number), L is the cable inductance per unit length, and C is the cable capacitance per unit length.

At low frequencies, when f is small, the impedance Z is dominated by the resistance R. At high frequencies, when f is large, the impedance Z is dominated by inductance L for a given capacitance C. Since the return current of a signal always follows the lowest impedance path, at low frequencies the signal return current follows the return path with least resistance. At high frequencies, the signal return current follows the return path with lowest inductance (for given capacitor value).

Conventional AC-grounding scheme with the chassis ground and digital ground being connected by capacitors often place the capacitors 110 in an asymmetric position relative to the signal line as shown in FIG. 1. The asymmetric placement of capacitors 110 leads to unbalanced (asymmetric) equivalent inductances of return path relative to the position of differential (or single-ended) signal. As shown in FIG. 1, a first return path 112 is significantly larger than second return path 114.

The unbalanced/asymmetric equivalent inductances of return path "force" the signal return current to flow asymmetrically relative to the position of differential (or single-ended) signal 108. The Applicant has found that this results in an asymmetric and unbalanced distribution of signal return current which in turn causes two fundamental EMC/EMI problems: (1) induce differential to common mode-conversion (or common mode to differential mode-conversion) of the differential signal, and (2) increase direct radiation emissions, particularly at far field.

Accordingly, methods and structures disclosed in the present application provide for symmetric placement of capacitors to mitigate these fundamental EMC/EMI problems as will be discussed below in connection with FIG. 2.

Figure 2:
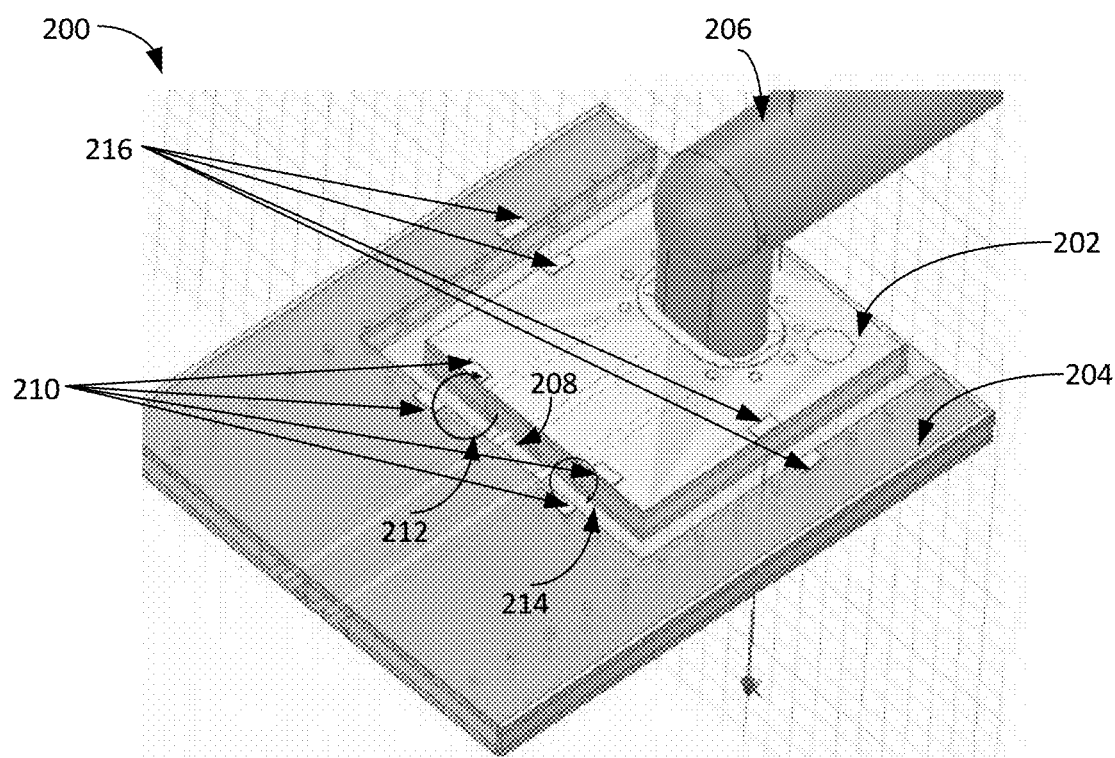
FIG. 2 is a plan view of a printed circuit board incorporating a first implementation of the subject matter of this disclosure.

FIG. 2 shows a portion of a printed circuit board 200 with a chassis ground 202 and a digital ground 204 in accordance with one implementation of the present disclosure. As seen in FIG. 2, the gap between chassis ground 202 and digital ground 204 serves to electrically isolate the digital ground from the chassis ground. Shielded single twisted copper wire pair 206 is used to connect one automotive Ethernet device (not shown) to an Electronic Control Unit (ECU) corresponding to digital ground 204. Shielded single twisted copper wire pair 206 is grounded via connection to chassis ground 202. Signal transmission line 208 carries a differential (or single-ended) signal from the one automotive Ethernet device to the ECU and returns a second differential (or single-ended) signal from ECU to the one automotive Ethernet device.

Printed circuit board 200 includes a first pair of capacitors 210 and a second pair of capacitors 216 coupling the digital ground to the chassis ground. Any number of pairs of capacitors may be used to couple the digital and chassis grounds. In one implementation, printed circuit board 200 includes 10 pairs of capacitors coupling the digital ground to the chassis ground.

As discussed above in connection with FIG. 1, the return current of a signal always follows the lowest impedance path, and at high frequencies, the signal return current follows the return path with lowest inductance (for given capacitor value). As seen in FIG. 2, each respective pair of capacitors 210 are symmetrically positioned to be equidistant relative to the position of differential (or single-ended) signal passing through signal transmission line 208. In one implementation, each given capacitor of a respective pair of capacitors is substantially an equal distance (e.g., within 5% of less difference) to the position of differential (or single-ended) signal passing through signal transmission line 208 relative to the other capacitor of the pair of capacitors. The balanced/symmetric equivalent inductances of return paths (due to the symmetric placement of capacitors 210 and 216) "force" the signal return current to flow symmetrically relative to the position of differential (or single-ended) signal passing through signal transmission line 208. As seen in FIG. 2, the signal return paths 212 and 214 are substantially equal (e.g., withing 5% or less difference) thereby reducing the differential to common mode conversion of differential signal 208 and reducing the direct radiation emissions.

In accordance with implementations of the subject matter of this disclosure, symmetrical placement of the capacitors on the printed circuit board to couple the digital and chassis ground in accordance with the implementation of FIG. 2 significantly reduces (~6 dB) the coupled noise from the AC-ground connection when compared to the asymmetric placement of capacitors in accordance with FIG. 1.

Figure 3:
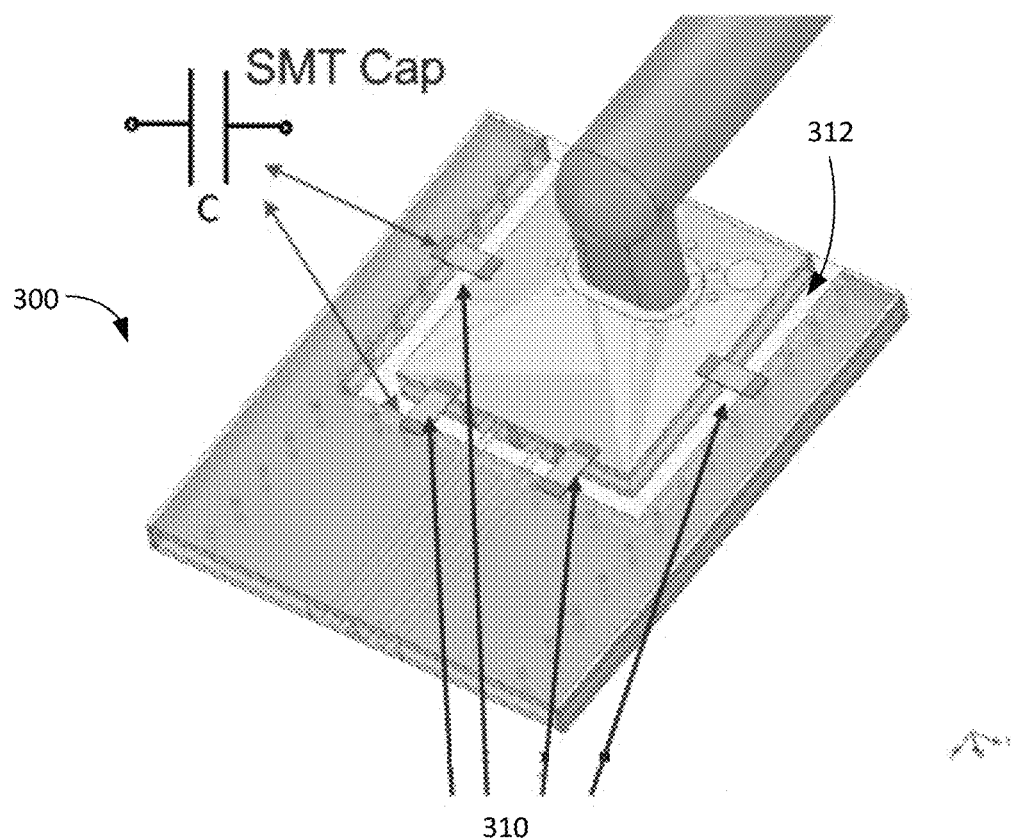
FIG. 3 is a plan view of a printed circuit board incorporating a second implementation of the subject matter of this disclosure.

FIG. 3 is a plan view of a printed circuit board 300 incorporating one implementation of the subject matter of this disclosure. More particularly, printed circuit board 300 includes four surface mounted capacitors 310 symmetrically positioned across the gap 312 between the digital ground 204 and the chassis ground 202. As discussed above in connection with FIG. 2, balanced/symmetric equivalent inductances of return paths (due to the symmetric placement of capacitors 210 and 216) "force" the signal return current to flow symmetrically relative to the position of differential (or single-ended) signal passing through signal transmission line 208, in an implementation.

Figure 4:
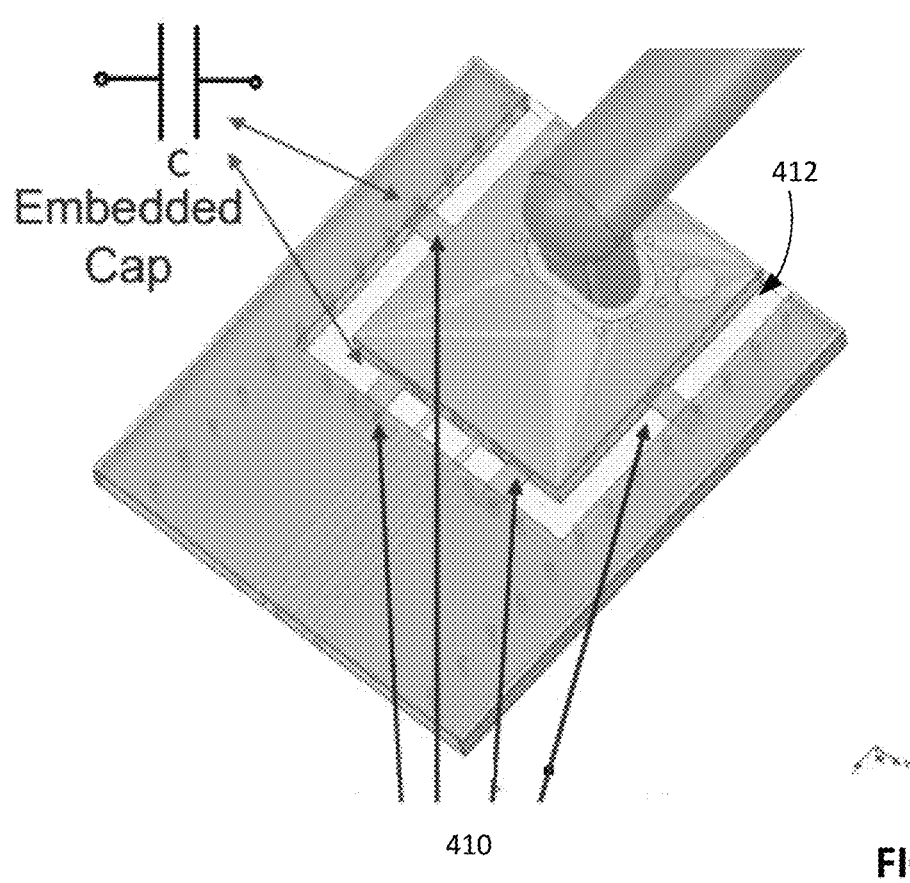
FIG. 4 is a plan view of a printed circuit board incorporating a third implementation of the subject matter of this disclosure.

FIG. 4 is a plan view of a printed circuit board 400 incorporating another implementation of the subject matter of this disclosure. More particularly, printed circuit board 400 includes four capacitors 410 symmetrically embedded into the printed circuit board 400 across the gap 412 between the digital ground 204 and the chassis ground 202. In comparison to the surface mounted capacitors 310 of FIG. 3, embedded capacitors 410 have much smaller equivalent series inductance which is dominant factor for the EMC/EMI performance of the AC-coupled ground connection. Specifically, capacitors 410 embedded into the printed circuit board 400 substrate have extremely short electrical paths that reduce parasitic capacitance and inductance, lower power bus noise, and minimize EMI.

Figure 5:
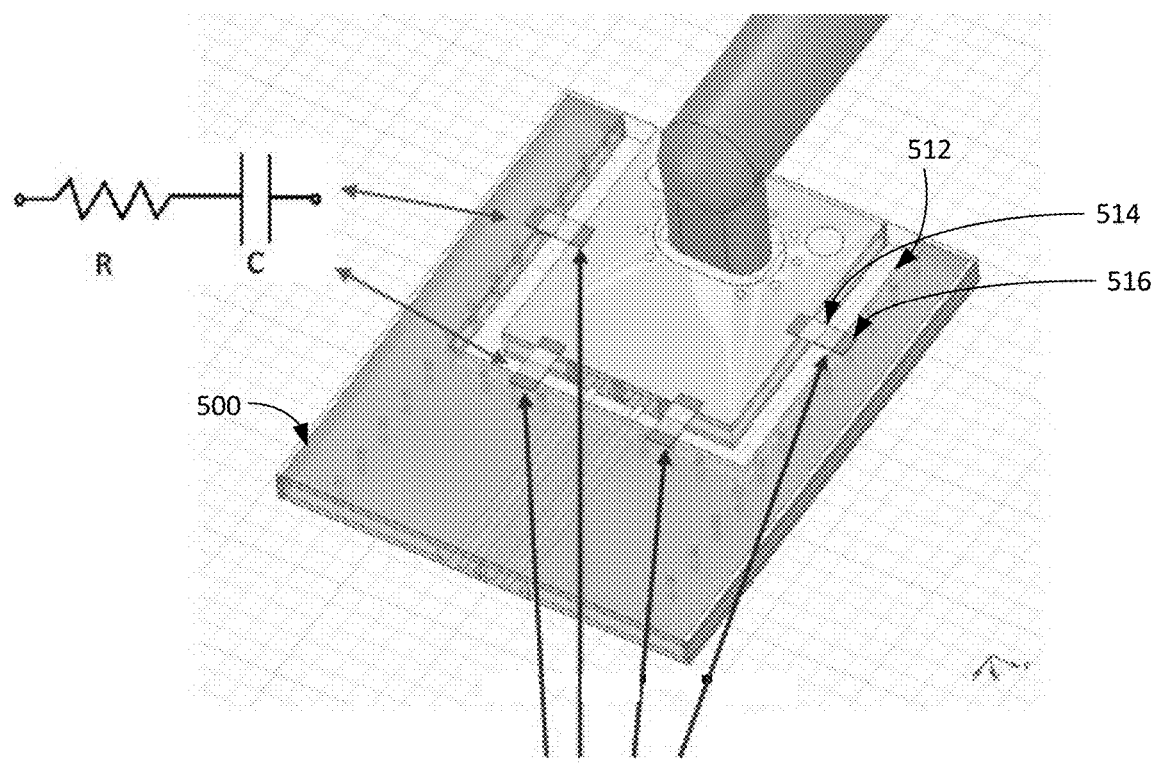
FIG. 5 is a plan view of a printed circuit board incorporating a fourth implementation of the subject matter of this disclosure.

FIG. 5 is a plan view of a printed circuit board 500 incorporating yet another implementation of the subject matter of this disclosure. More particularly, printed circuit board 500 replaces the four symmetrically surface mounted capacitors 310 of FIG. 3 with four combinations of a capacitor 514 and a resistor 516 in a series connection across the gap 512 between the digital ground 204 and chassis ground 202. In comparison to the surface mounted capacitors 310 of FIG. 3, the series resistors dampen and attenuate the high-frequency resonant noises in ground planes. The high-frequency resonant noises, which are associated with and/or enhanced by cable resonances, are absorbed by the series resistors. Accordingly, printed circuit board 500 structure helps mitigate the radiated emissions and transient problems generated due to the cable resonances.

Figure 6:
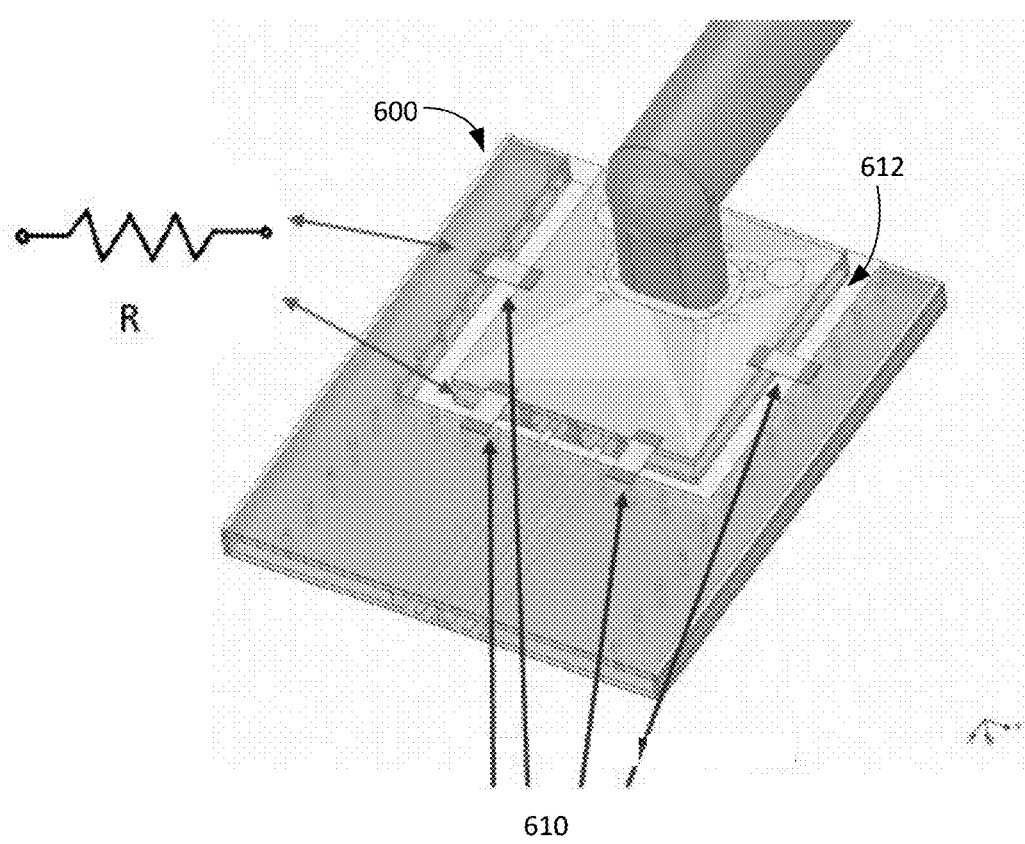
FIG. 6 is a plan view of a printed circuit board incorporating a fifth implementation of the subject matter of this disclosure.

FIG. 6 is a plan view of a printed circuit board 600 incorporating yet another implementation of the subject matter of this disclosure. More particularly, printed circuit board 600 replaces the four symmetrically surface mounted capacitors 310 of FIG. 3 with four symmetrically surface mounted resistors 610. In one other implementation, the four symmetrically positioned resistors 610 are embedded into the printed circuit board 600. As discussed above in connection with FIG. 5, the resistors 610 dampen and attenuate the high-frequency resonant noises in ground planes. The high-frequency resonant noises, which are associated with and/or enhanced by cable resonances, are absorbed by the series resistors. Accordingly, printed circuit board 600 structure helps mitigate the radiated emissions and transient problems generated due to the cable resonances.

The above implementations can be provided in any combination to help mitigate the EMC/EMI problems in high-speed automotive interfaces. For example, in one implementation, a printed circuit board may include two symmetrically embedded capacitors and four or more symmetrically surface mounted resistors to couple the digital and chassis grounds. In addition, the above implementations can also be provided in combination with symmetrically positioned capacitors, resistors, and other types of passive components such as inductors or ferrite beads.

Figure 7:
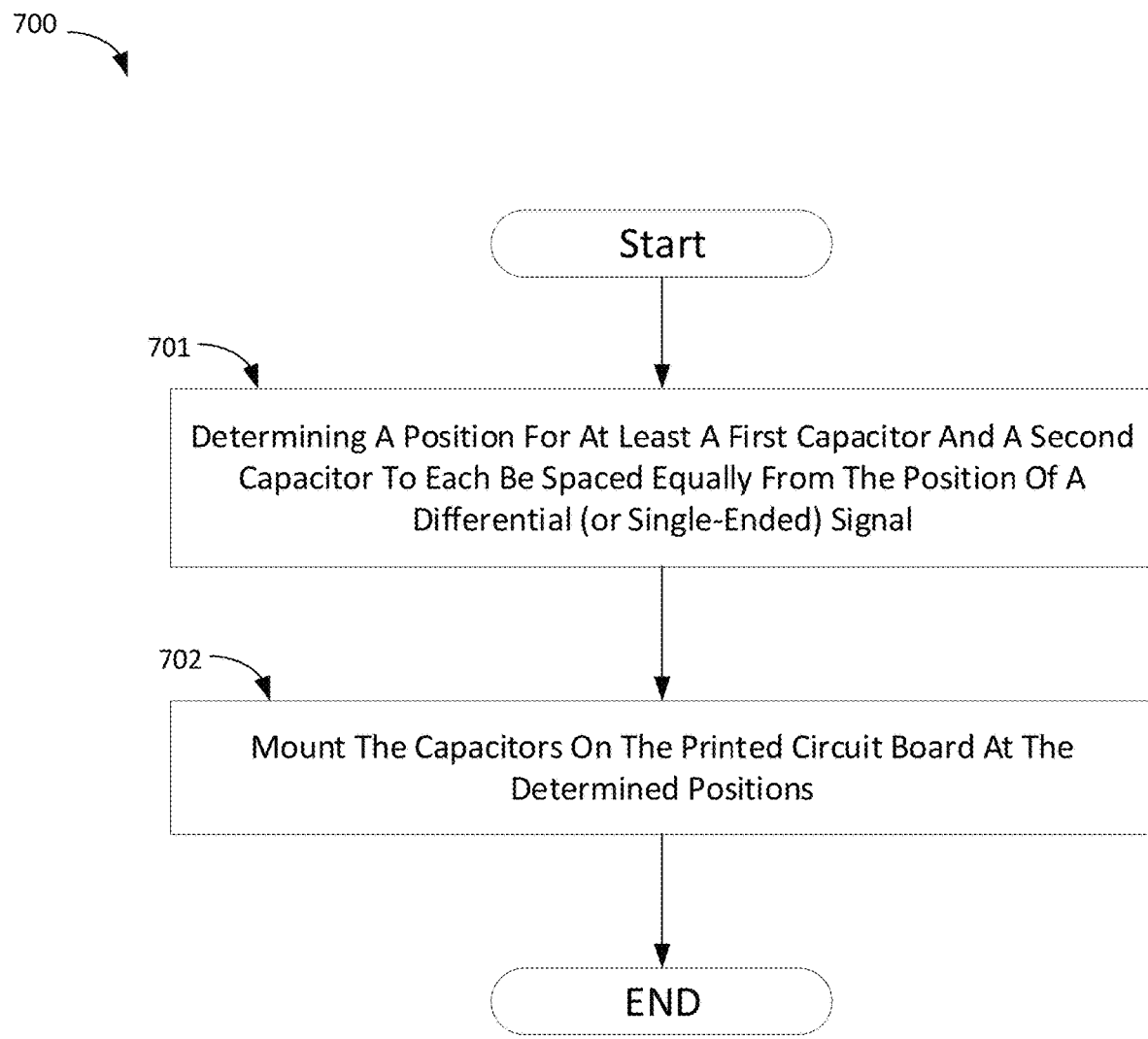
FIG. 7 is a flow diagram illustrating a method according to an implementation of the subject matter of this disclosure for forming a printed circuit board.

A method 700 according to implementations of the subject matter of this disclosure is diagrammed in the flow chart of FIG. 7.

Method 700 begins at 701 where a positioning of at least a first capacitor and a second capacitor is determined such that the first and second capacitors are symmetrically positioned to be equidistant from the position of a differential (or single-ended) signal.

At 702, the first and second capacitors, as configured at 701, are mounted on the surface of the printed circuit board in a configuration where each of first and second capacitors is spaced equally from the signal line carrying the differential (or single-ended) signal. The actual mounting of the capacitors may be performed using known printed circuit board techniques. Method 700 then ends.

Thus it is seen that a printed circuit board, and a method of forming a printed circuit board, using symmetrically positioned capacitive elements to couple digital and chassis grounds, have been provided.

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A printed circuit board configured to be coupled to an automotive Ethernet connection, the printed circuit board comprising:
    a signal line layer on which a signal path is disposed;
    a ground layer disposed above the signal line layer, the ground layer including (i) a digital ground, and (ii) a chassis ground electrically insulated from the digital ground;
    a first capacitor coupling the digital ground and the chassis ground, wherein the first capacitor is positioned at a first distance from the signal path; and
    a second capacitor coupling the digital ground and the chassis ground, wherein the second capacitor is symmetrically positioned, relative to the first capacitor at a second distance from the signal path, and wherein the second distance is substantially equal to the first distance.

2. The printed circuit board of claim 1, further comprising:
    at least a third capacitor coupling the digital ground and the chassis ground, wherein the third capacitor is positioned at a third distance from the signal path; and
    at least a fourth capacitor coupling the digital ground and the chassis ground, wherein the fourth capacitor is symmetrically positioned, relative to the third capacitor, at a fourth distance from the signal path, and wherein the third distance is substantially equal to the fourth distance.

3. The printed circuit board of claim 2, wherein the at least third capacitor and the at least fourth capacitor each include a plurality of capacitors.

4. The printed circuit board of claim 1, wherein each of the first capacitor and the second capacitor are embedded into the ground layer of the printed circuit board.

5. The printed circuit board of claim 1, wherein each of the first capacitor and the second capacitor are mounted on top of the printed circuit board.

6. The printed circuit board of claim 1, wherein the signal path is a differential signal path.

7. The printed circuit board of claim 1, wherein the first capacitor and the second capacitor are positioned on opposite sides of the signal path.

8. The printed circuit board of claim 1, further comprising:
    a first resistor coupling the digital ground and the chassis ground, wherein the first resistor is positioned at a third distance from the signal path; and
    a second resistor coupling the digital ground and the chassis ground, wherein the second resistor is symmetrically positioned, relative to the first resistor, at a fourth distance from the signal path, and wherein the third distance is substantially equal to the fourth distance.

9. The printed circuit board of claim 1, further comprising:
a first resistor connected in series to the first capacitor, the first resistor and the first capacitor coupling the digital ground and the chassis ground, wherein the first resistor connected in series to the first capacitor is positioned at a third distance from the signal path; and
a second resistor connected in series to the second capacitor, the second resistor and the second capacitor coupling the digital ground and the chassis ground, wherein the second resistor connected in series to the second capacitor is symmetrically positioned, relative to the first resistor connected in series to the first capacitor at a fourth distance from the signal path, and wherein the third distance is substantially equal to the fourth distance.

10. The printed circuit board of claim 1, wherein the digital ground is electrically insulated from the chassis ground via a dielectric material.

11. A method of configuring a printed circuit board for coupling to an automotive Ethernet connection, having a signal line layer on which a signal path is disposed and a ground layer disposed above the signal line layer, the ground layer including a digital ground and a chassis ground electrically insulated from the digital ground, the method comprising:
determining a position for at least a first capacitor to couple the digital ground and the chassis ground so that the first capacitor is positioned at a first distance from the signal path;
determining a position for at least a second capacitor to couple the digital ground and the chassis ground so that the second capacitor is symmetrically positioned, relative to the first capacitor, at a second distance from the signal path, where the second distance is substantially equal to the first distance; and
mounting each of the first capacitor and the second capacitor at the respective determined positions for the first capacitor and the second capacitor on the printed circuit board.

12. The method of claim 11, further comprising:
determining a position of at least a third capacitor coupling the digital ground and the chassis ground so that the third capacitor is positioned at a third distance from the signal path;
determining a position of at least a fourth capacitor coupling the digital ground and the chassis ground, so that the fourth capacitor is symmetrically positioned, relative to the third capacitor, at a fourth distance from the signal path, and wherein the third distance is substantially equal to the fourth distance; and
mounting the at least third capacitor and the at least fourth capacitor at the respective determined positions for the at least third capacitor and the at least fourth capacitor on the printed circuit board.

13. The method of claim 12, wherein mounting the at least third capacitor and the at least fourth capacitor comprises mounting a plurality of capacitors.

14. The method of claim 11, wherein mounting each of the first capacitor and the second capacitor at the respective determined positions for the first capacitor and the second capacitor on the printed circuit board comprises embedding each of the first capacitor and the second capacitor into the ground layer of the printed circuit board.

15. The method of claim 11, wherein mounting each of the first capacitor and the second capacitor at the respective determined positions for the first capacitor and the second capacitor on the printed circuit board comprises mounting each of the first capacitor and the second capacitor on top of the printed circuit board.

16. The method of claim 11, wherein the signal path is a differential signal path.

17. The method of claim 11, wherein mounting each of the first capacitor and the second capacitor at the respective determined positions for the first capacitor and the second capacitor on the printed circuit board comprises mounting the first capacitor and the second capacitor on opposite sides of the signal path.

18. The method of claim 11, further comprising:
determining a position of a first resistor coupling the digital ground and the chassis ground, so that the first resistor is positioned at a third distance from the signal path;
determining a position of a second resistor coupling the digital ground and the chassis ground, so that the second resistor is symmetrically positioned, relative to the first resistor, at a fourth distance from the signal path, and wherein the third distance is equal to the fourth distance; and
mounting each of the first resistor and the second resistor at the respective determined positions for the first resistor and the second resistor on the printed circuit board.

19. The method of claim 11, further comprising:
determining a position of a first resistor connected in series to the first capacitor, the first resistor and the first capacitor coupling the digital ground and the chassis ground, so that the first resistor connected in series to the first capacitor is positioned at a third distance from the signal path;
determining a position of a second resistor connected in series to the second capacitor, the second resistor and the second capacitor coupling the digital ground and the chassis ground, so that the second resistor connected in series to the second capacitor is symmetrically positioned, relative to the first resistor connected in series to the first capacitor, at a fourth distance from the signal path, and wherein the third distance is equal to the fourth distance; and
mounting (i) the first resistor connected in series to the first capacitor and (ii) the second resistor connected in series to the second capacitor at the respective determined positions for the first resistor and the second resistor on the printed circuit board.

20. The method of claim 11, wherein the digital ground is electrically insulated from the chassis ground via a dielectric material.

* * * * *